United States Patent
Chow et al.

(10) Patent No.: US 10,054,485 B2
(45) Date of Patent: Aug. 21, 2018

(54) UV LED-PHOSPHOR BASED HYPERSPECTRAL CALIBRATOR

(71) Applicant: RAYTHEON COMPANY, Waltham, MA (US)

(72) Inventors: James R. Chow, San Gabriel, CA (US); Susan B. Spencer, Rolling Hills Estates, CA (US)

(73) Assignee: RAYTHEON COMPANY, Waltham, MA (US)

( * ) Notice: Subject to any disclaimer, the term of this patent is extended or adjusted under 35 U.S.C. 154(b) by 46 days.

(21) Appl. No.: 15/072,508

(22) Filed: Mar. 17, 2016

(65) Prior Publication Data

US 2017/0268928 A1    Sep. 21, 2017

(51) Int. Cl.
| | |
|---|---|
| *G01J 3/00* | (2006.01) |
| *G01J 3/02* | (2006.01) |
| *G01J 3/28* | (2006.01) |
| *H01L 33/50* | (2010.01) |
| *H01L 33/58* | (2010.01) |

(52) U.S. Cl.
CPC .......... *G01J 3/0297* (2013.01); *G01J 3/0262* (2013.01); *G01J 3/2823* (2013.01); *H01L 33/50* (2013.01); *H01L 33/58* (2013.01); *G01J 2003/2826* (2013.01)

(58) Field of Classification Search
CPC .... G01J 3/02; G01J 3/28; H01L 33/50; H01L 33/58
See application file for complete search history.

(56) References Cited

U.S. PATENT DOCUMENTS

| | | | |
|---|---|---|---|
| 6,734,467 B2 | 5/2004 | Schlereth et al. | |
| 6,765,237 B1 | 7/2004 | Doxsee et al. | |
| 7,040,774 B2 * | 5/2006 | Beeson ............. | G02B 19/0019 |
| | | | 362/257 |
| 7,442,167 B2 | 10/2008 | Dunki-Jacobs et al. | |
| 7,531,960 B2 | 5/2009 | Shimizu et al. | |
| 8,662,950 B2 | 3/2014 | Chen et al. | |
| 8,786,179 B2 | 7/2014 | Thompson et al. | |

(Continued)

FOREIGN PATENT DOCUMENTS

| | | |
|---|---|---|
| CN | 104897279 A | 9/2015 |
| EP | 1571715 A1 | 9/2005 |

(Continued)

OTHER PUBLICATIONS

International Search Report and Written Opinion for application No. PCT/US2017/012239 dated May 2, 2017.

(Continued)

*Primary Examiner* — Abdullahi Nur
(74) *Attorney, Agent, or Firm* — Lando & Anastasi, LLP

(57) ABSTRACT

A hyperspectral calibrator comprises a composite light source disposed within a housing and including an ultraviolet light emitting diode (UV LED) and a phosphor arranged such that a first beam generated by the UV LED is transmitted through the phosphor to produce and emit a calibration beam that is spectrally continuous over a wavelength range extending from 0.4 μm to 0.7 μm, the housing having an output opening and configured to direct the calibration beam emitted from the composite light source to the output opening to produce a calibration beam at the output opening.

18 Claims, 7 Drawing Sheets

(56) References Cited

U.S. PATENT DOCUMENTS

| | | | |
|---|---|---|---|
| 8,912,562 B2 | 12/2014 | Ouderkirk et al. | |
| 8,969,893 B2 | 3/2015 | Kim | |
| 9,018,830 B2 | 4/2015 | Du et al. | |
| 9,029,895 B2 | 5/2015 | Lee et al. | |
| 9,035,326 B2 | 5/2015 | Cho | |
| 9,086,327 B2 | 7/2015 | Chow et al. | |
| 2005/0057145 A1 | 3/2005 | Shieh et al. | |
| 2008/0046217 A1* | 2/2008 | Polonskiy | G01J 3/28 702/179 |
| 2009/0231832 A1 | 9/2009 | Zukauskas et al. | |
| 2013/0070443 A1 | 3/2013 | Pan et al. | |
| 2013/0293123 A1 | 11/2013 | Deak, Sr. et al. | |

FOREIGN PATENT DOCUMENTS

| | | |
|---|---|---|
| EP | 2600126 A2 | 6/2013 |
| WO | 9923230 A1 | 5/1999 |
| WO | 2012091971 A1 | 7/2012 |
| WO | 2012119158 A1 | 9/2012 |

OTHER PUBLICATIONS

Pulli et al., "Advantages of white LED lamps and new detector technology in photometry", Light: Science & Applications, vol. 4, No. 9, Sep. 11, 2015.

Tanaka et al., "Operation Concept of the Second-generation Global Imager (SGLI)", Proc. of SPIE., vol. 7862, 2010.

\* cited by examiner

UV LED-PHOSPHOR BASED HYPERSPECTRAL CALIBRATOR

BACKGROUND

High performance hyperspectral imagers are valuable instruments in providing calibrated radiometric imagery and determining the spectral composition of detected electromagnetic radiation. Hyperspectral sensors behave like a radiometric sensor by measuring the calibrated light flux which is received at each pixel of the detector emanating from an object through reflection or emission. Equally as important, these sensors also differentiate the spectral composition of the electromagnetic radiation. The resultant information combines a conventional two-dimensional radiometric image with a third dimension containing spectrophotometric response across a broad spectral range, some of these responses are unique indicators of materials and processes. The method is entirely non-contact and non-invasive, making it a common imaging method in the fields of astronomy, agriculture, biomedical imaging, geosciences, physics, and surveillance, for example.

Various hyperspectral imaging applications use an on-board calibrator that includes one or more light sources that provide reference photon fluxes that span the spectral wavelength range of interest, for example, from visible (e.g., ~400 nm-700 nm) to near-infrared (NIR; e.g., ~800 nm-1 µm) to short-wave infrared (SWIR; e.g., ~1 µm-2 µm) to mid-wave infrared (MWIR; e.g., ~3 µm-5 µm) to long-wave infrared (LWIR; e.g., ~8 µm-15 µm). One example of a typical calibrator light source is a tungsten-halogen lamp. When tungsten-halogen lamps are operated at various temperatures, they provide sufficient photon flux across the above-mentioned wavelength range with the exception of the blue range. Higher temperature operations are presently limited by the melting temperature of the filament and thus limit the blue output. Further, multiple power cycling and corresponding temperature cycling events induce stress into the brittle tungsten filament, leading to fracture, and ultimate failure. High temperature light sources, such as Xenon lamps, exhibit a broadband and high output emission. However, these lamps require a large amount of power and generate a large amount of heat, requiring an additional cooling subsystem. Additionally, the high temperature plasma generated imparts stresses to the glass envelope, leading to premature failure after limited thermal cycling (e.g., ~50 cycles).

Recently, commercial lighting technology has advanced to low-power light emitting diodes (LEDs) that are commonly used in traffic lights, automobile lights, and home track lighting, for example. These applications have used specially doped semiconductors that emit in narrow bands in the blue, green, or red wavelength ranges, ±0.02 µm approximately. Further, various lighting applications use a blue LED in combination with a phosphor to down-convert to a continuum of wavelengths from green to red. Although such advances have resulted in bright white sources to the human eye, the blue emission (e.g., from ~0.4 µm-0.43 µm) is still lacking.

Thus, there remains a continuing need for hyperspectral calibrators that are compact and lower power, emit over the full visible to LWIR spectral range, including the blue emission, and exhibit temperature cycling stability.

SUMMARY OF THE INVENTION

Aspects and embodiments are directed to hyperspectral calibrators, and in particular, to a hyperspectral calibrator that uses an LED source and a phosphor.

In some embodiments, a hyperspectral calibrator comprises a composite light source disposed within a housing and including an ultraviolet light emitting diode (UV LED) and a phosphor arranged such that a first beam generated by the UV LED is transmitted through the phosphor to produce and emit a calibration beam that is spectrally continuous over a wavelength range extending from 0.4 µm to 0.7 µm, wherein the housing has an output opening and is configured to direct the calibration beam emitted from the composite light source to the output opening to produce a calibration beam at the output opening.

In some aspects, the housing is configured such that the calibration beam emitted from the composite light source undergoes at least three reflections before exiting from the output opening as the calibration beam.

In some aspects, the housing further comprises a baffle partially surrounding the composite light source.

In some aspects, the at least one inner surface of the housing includes a diffusive coating. In some aspects, the diffusive coating includes a fluoropolymer.

In some aspects, the phosphor is coated on the UV LED.

In some aspects, the phosphor coating includes an inorganic metal oxide.

In some aspects, the composite light source includes a plurality of UV LEDs each having the phosphor coating.

In some aspects, the composite light source is configured to emit the calibration beam with an emission spectrum that includes a plurality of defined peaks within the wavelength range.

In some aspects, the hyperspectral calibrator further comprises an infrared light source configured to produce an infrared calibration beam, the housing being further configured to direct the infrared calibration beam through the output opening.

In some embodiments, a hyperspectral imaging system comprises a hyperspectral sensor configured to collect light reflected from an observed scene and to output a two-dimensional image of the observed scene, and a hyperspectral calibrator including an ultraviolet (UV) light emitting diode (LED) and a phosphor and being configured to emit visible light that is spectrally continuous over a wavelength range extending from 0.4 µm to 0.7 µm, the hyperspectral calibrator being further configured to selectively direct a calibration beam to the hyperspectral sensor, the calibration beam including the visible light.

In some aspects, the phosphor comprises an inorganic metal oxide.

In some aspects, the phosphor is coated on the UV LED.

In some aspects, the hyperspectral calibrator further comprises an infrared light source configured to emit infrared light, and the calibration beam further includes the infrared light.

In some aspects, the hyperspectral imaging system includes a plurality of UV LEDs each having the phosphor coating.

In some aspects, the UV LED is configured to emit the light with an emission spectrum that includes a plurality of defined peaks within the wavelength range.

In some embodiments, a method of hyperspectral calibration comprises providing a composite light source including an ultraviolet (UV) light emitting diode (LED) and a phosphor, generating a calibration beam including visible light emitted from the composite light source, the visible light being spectrally continuous over a wavelength range extending from 0.4 µm to 0.7 µm, selectively directing the calibration beam to a hyperspectral imaging sensor, measuring an output from the hyperspectral imaging sensor responsive to receiving the calibration beam at the hyperspectral imaging sensor to provide a measured output, and calibrating the hyperspectral imaging sensor based on a comparison between the measured output and a known spectrum of the calibration beam.

In some aspects, the known spectrum of the calibration beam includes a plurality of defined peaks within the wavelength range, and calibrating the hyperspectral imaging sensor includes performing wavelength calibration based on at least one of the plurality of defined peaks.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Hyperspectral imaging is used in a variety of applications. The hyperspectral sensor system observes a target and projects the two-dimensional spectral image onto a high-resolution imaging sensor, such as a charge coupled device (CCD). A computer may record the CCD output signal, and store the signal as raw spectral data that is analyzed and transformed into a viewable image for a human operator. As discussed above, various hyperspectral imaging applications require an on-board calibrator to provide a well-established reference that is used in interpreting and transforming the spectral data obtained by the sensor. For example, the calibrator may emit a well-known, well-defined spectral emission signature, which may be compared to the spectral data from a target object collected by the hyperspectral sensor. However, as discussed above, conventional light sources that can be used in such calibrators have numerous drawbacks, and do not provide adequate performance for state-of-the-art and future hyperspectral imaging applications.

Figure 1:
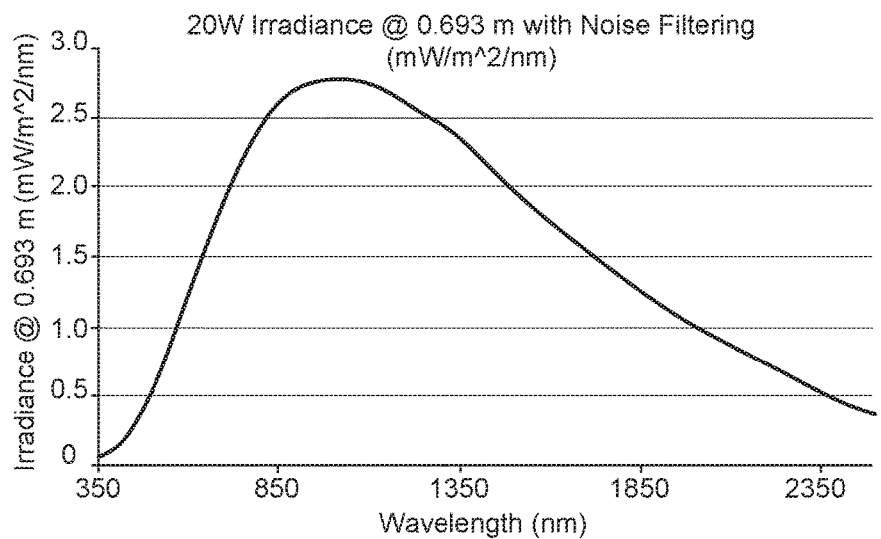
FIG. 1 is a graph showing a typical irradiance spectrum of a tungsten-halogen light source operated below 3000 Kelvin.

The human eye sees color of visible light in mostly three bands, namely red, green, and blue. Spectral imaging, however, divides the spectrum into many more bands than the human eye does. Thus, hyperspectral imaging calibrators must be capable of emitting light over the entire spectrum of interest, which can extend over multiple spectral bands from the visible through the LWIR (e.g., from ~0.4 µm to 15 µm). As discussed above, conventional light sources, such as commercial LED lighting and filament-based light sources (such as tungsten-halogen sources) that may exhibit broadband emission to the human eye are actually lacking in blue wavelength emission. For example, referring to FIG. 1, there is illustrated an emission spectrum of a tungsten-halogen light source operated below 3000 Kelvin (K). The graph shows irradiance (light emission intensity or flux) at 0.693 m, with noise filtering, as a function of wavelength. Such light sources do not produce a sufficient amount of irradiance in the shorter blue wavelengths, particularly from 0.40 to 0.43 µm, to be used (and achieve adequate performance) in calibrators for hyperspectral imaging systems. Furthermore, as discussed above, plasma-based light sources have very high power requirements, which can be prohibitive in many applications, and are prone to failure caused by thermal cycling.

Figure 2:
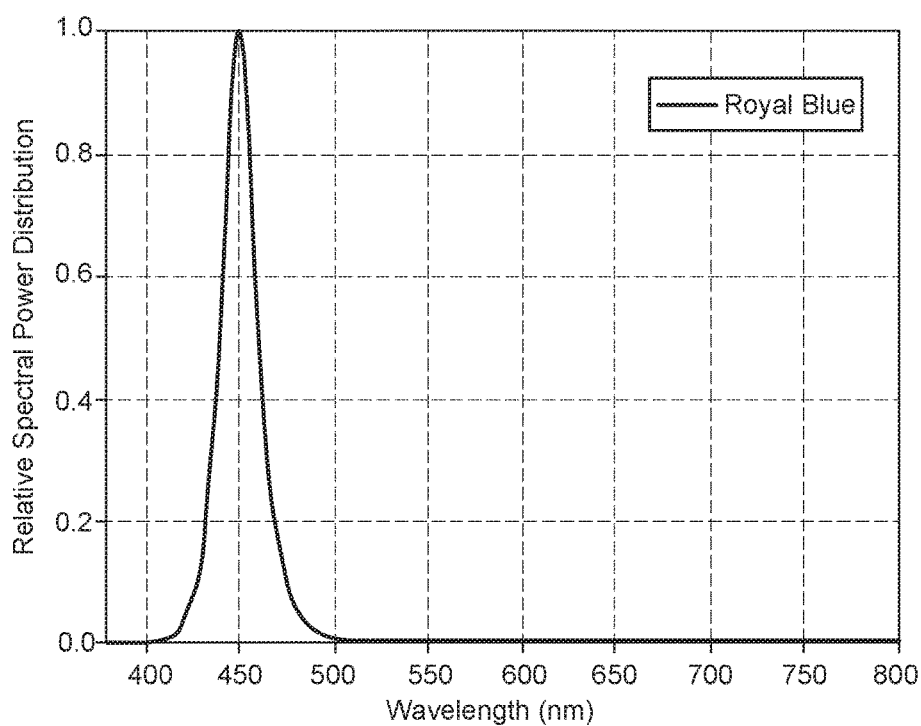
FIG. 2 is a graph showing the emission spectrum of a typical blue LED.

Referring to FIG. 2, a spectral power distribution of a typical blue LED is shown. The graph shows a single high narrowband emission at about 0.45±0.02 µm; however, similar to the tungsten-halogen light source of FIG. 1, the typical blue LED does not produce sufficient irradiance at the shorter blue wavelengths, particularly, from ~0.40 to 0.43 µm, making it unsuitable for use in full range hyperspectral calibrators.

Figure 3:
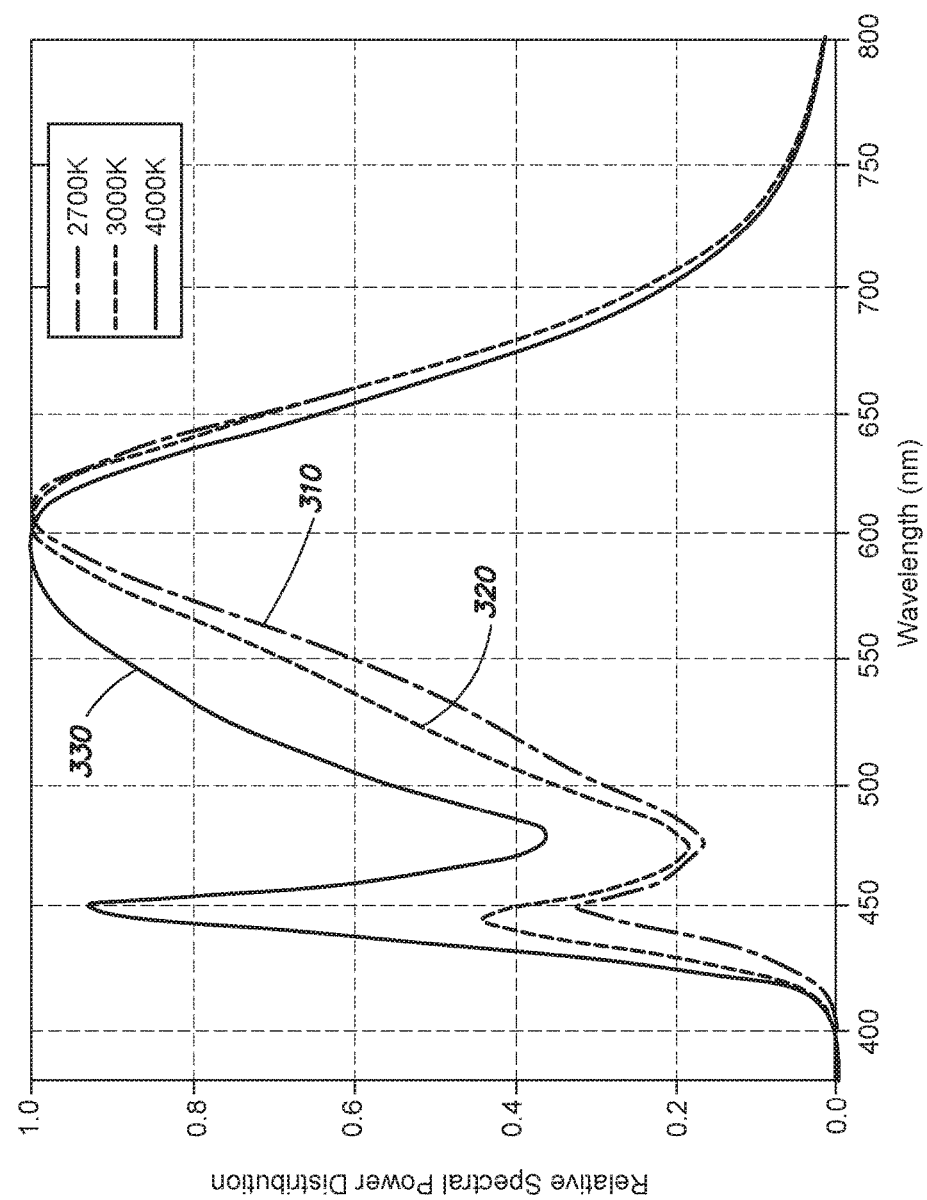
FIG. 3 is a graph showing the emission spectrum of a typical blue LED with a phosphor coating.

As discussed above, certain commercial lighting applications have used blue LEDs in combination with a phosphor to achieve emission at the green and red wavelengths; however, this arrangement fails to address the lack of sufficient flux at the shorter blue wavelengths. For example, FIG. 3 illustrates the spectral power distribution (as a function of wavelength) of a blue LED with a phosphor coating. Trace 310 shows the spectral power distribution of the light source operating at a correlated color temperature (CCT) of 2700 K, trace 320 corresponds to 3000 K, and trace 330 corresponds to 4000 K. As shown, the relatively high narrowband blue emission at 0.45±0.02 µm of the blue LED is retained, and due to the excitation of the phosphor coating, there is also emission from green to red. However, it is evident that the irradiance diminishes significantly below about 0.44 µm, and light emission at the shorter blue wavelengths is still lacking. Thus, although a human may perceive "white light" emitted from a typical LED-phosphor combination light source having a spectrum such as that shown in FIG. 3, the light is actually lacking in the shorter blue wavelengths, and for this reason, the light source is inadequate for use in full range hyperspectral calibrators.

Additionally, as discussed above, although arc-based light sources (such as Xenon lamps) can provide more broadband emission, these sources are also prone to failure when thermally cycled, and have prohibitive power and heat dissipation requirements.

Accordingly, aspects and embodiments are directed to providing a calibrator having components designed and configured to support the hyperspectral imaging and analysis requirements discussed above. In particular, certain embodiments may provide a calibrator that is low-power, has a well-defined emission spectrum, including sufficient irradiance at blue wavelengths and across the visible and infrared spectral regions to calibrate a hyperspectral imaging detector, has a predictable intensity of irradiance across the spectral band of interest over the expected life of the calibrator, and has wavelength stability.

As discussed in more detail below, certain aspects and embodiments provide a hyperspectral calibrator that uses commercially available ultraviolet (UV) LEDs and phosphor substrates to provide a continuous white light source from about 0.4 to 0.7 µm. The UV LED output may be matched with phosphor absorption bands to produce broadband phosphorescence across the blue to red wavelengths. In particular, as discussed further below, the UV LED may be coated with the phosphor or transmit through a phosphor coated window and may emit light in the shorter blue wavelengths that are currently not emitted by typical light sources used in hyperspectral imaging applications. Additionally, in certain embodiments, a filament-based light source can be used in combination with the LED-phosphor source to provide emission over the infrared bands of interest. Because the filament-based light source is only needed to provide near and short-wave infrared emission, it can be operated at relatively low temperature and power levels, thereby avoiding several disadvantages and drawbacks associated with high-temperature operation of such sources. Together, the two types of sources (LED-phosphor and filament-based) can provide a long-life, low-power, and temperature cycling robust calibrator.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

According to certain embodiments, a hyperspectral calibrator includes an LED light source that emits light in the ultraviolet spectral range, referred to herein as a UV LED, in combination with a phosphor to provide a broadband visible light source having particular characteristics that are advantageous for hyperspectral calibration. In particular, the hyperspectral calibrator may include a commercially available UV LED source. An LED is a two-lead semiconductor light source that emits light when activated. It is a p-n junction diode, which emits light when activated. When a suitable voltage is applied to the leads, electrons are able to recombine with electron holes within the device, releasing energy in the form of photons. The color of light produced by an LED source is dependent on the type of semiconducting material and doping used in its manufacture. Advantageously, UV LED sources are small and inexpensive, making them ideal light sources in compact, low-power hyperspectral calibrators.

Figure 4:
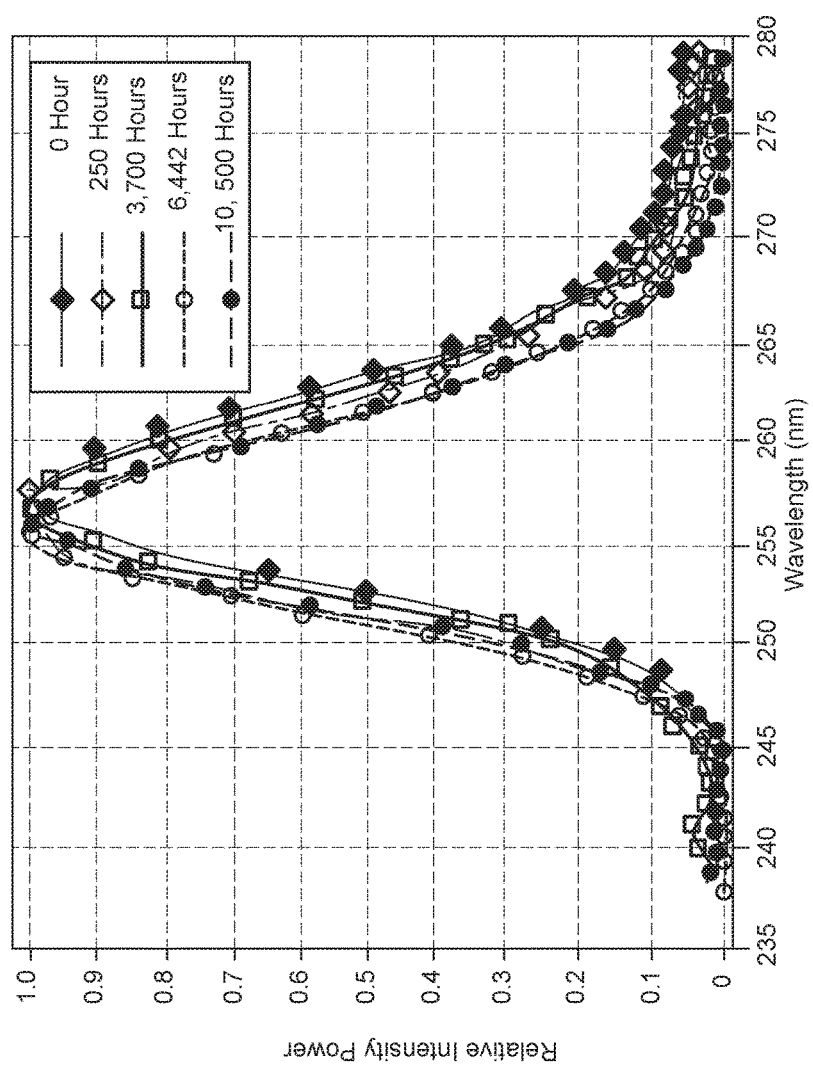
FIG. 4 is a graph showing the spectral power distribution of one example of a UV LED over time, demonstrating wavelength stability of the UV LED over time according to aspects of the invention.
Figure 5A:
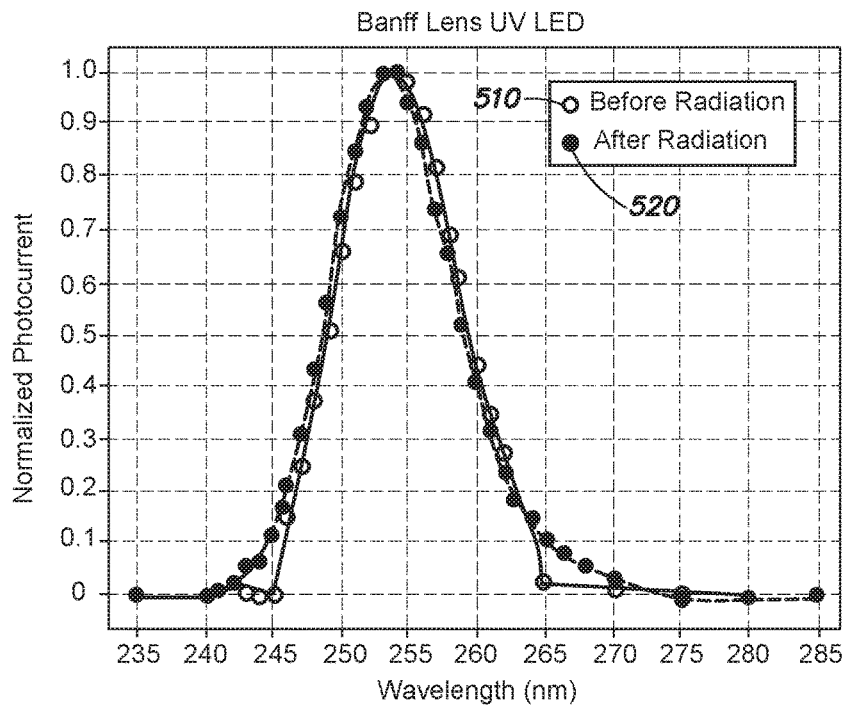
FIG. 5A is a graph showing the spectral power distribution of one example of a UV LED before and after radiation exposure, demonstrating radiation hardness of the UV LED according to aspects of the invention.
Figure 5B:
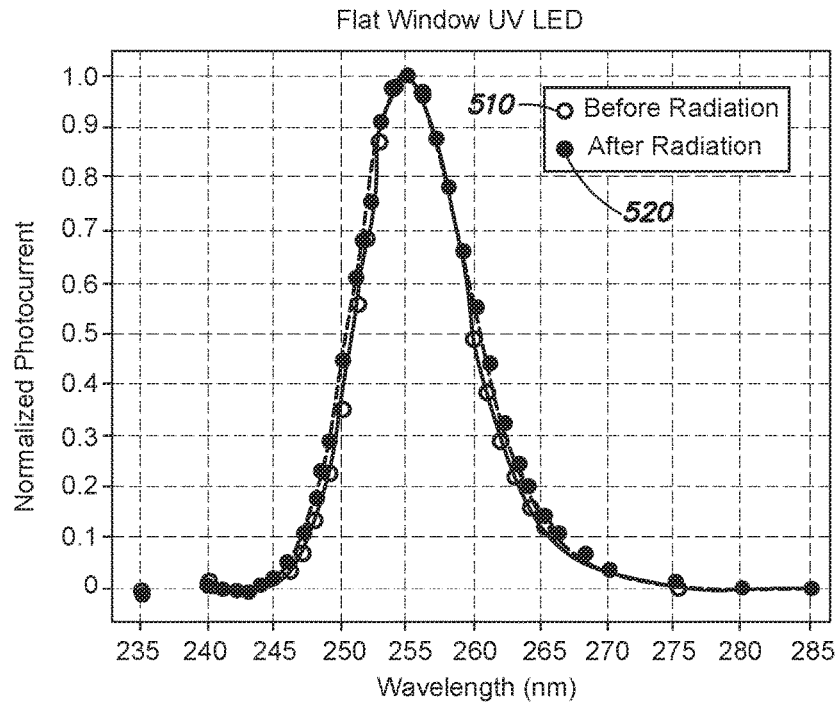
FIG. 5B is a graph showing the spectral power distribution of another example of a UV LED before and after radiation exposure, demonstrating radiation hardness of the UV LED according to aspects of the invention.

Additionally, UV LED light sources have been shown to have good stability, long life (e.g., >10,000 hours), and radiation hardness (e.g., up to about $2E^{12}$ p/cm$^2$) allowing them to be deployed in terrestrial, airborne, and space environments. For example, FIG. 4 illustrates the emission spectrum of one example of a UV LED over time. As can be seen with reference to FIG. 4, the UV LED has high narrowband emission centered around ~255-260 nm, and there is little variation in the emission intensity or profile from 0 to 10,500 hours of operation. Certain UV LEDs are manufactured using semiconductor technology and materials, such as aluminum-gallium-nitride (AlGaN) for example, and therefore are resistant to radiation and suitable for use in space. FIGS. 5A and 5B illustrate the results of a radiation hardness test applied to two examples of UV LEDS. FIG. 5A shows the emission spectrum of an example of a Banff lens type UV LED, and FIG. 5B shows the emission spectrum of a flat window type UV LED. In both FIGS. 5A and 5B, trace 510 shows the emission spectrum measured prior to exposure to radiation, and trace 520 shows the emission spectrum measured after proton irradiation with a fluence of $2 \times 10^{12}$ protons per cm$^2$. In both cases, the central emission wavelength is approximately 255 nm, and there is essentially no change resulting from the radiation.

Furthermore, unlike filament-based light sources which have spatially structured output light patterns and therefore require extensive processes and devices to randomize the photons (such as an integrating sphere, for example), UV LEDs do not carry a spatially distinct pattern, and therefore minimal randomization may be required. For example, the output light from the UV LED may be passed through a simple diffuser or even used directly without any external randomization.

As discussed above, embodiments of a calibrator can combine a UV LED and a phosphor to achieve broadband emission in the visible spectral range. In certain examples the output facet(s) of the UV LED may be coated with a phosphor layer. The phosphor layer may be excited by the light generated by the UV LED, and may down-convert the light to a different wavelength. Combinations of phosphors may provide different emission spectra. In particular, the phosphor layer may include one or more phosphors selected so as to produce emission over a desired spectral range. For example, the UV LED and phosphor layer may be configured together to match the UV LED output with the phosphor absorption band to produce a wideband phosphorescence from blue to red, and in particular, including the shorter blue wavelengths that are missing from the emissions of conventional light sources, as discussed above. In certain examples the phosphor layer is an inorganic metal oxide coating, and therefore can be processed to be radiation hard.

Figure 6A:
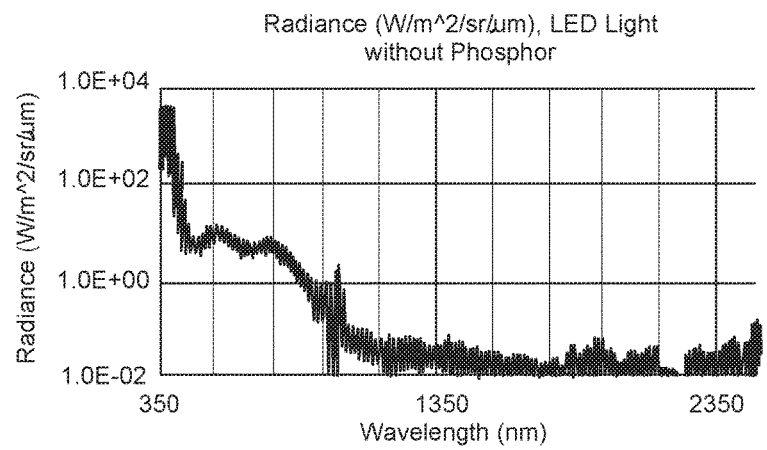
FIG. 6A is a graph showing the spectral power distribution of one example of an UV LED-source without a phosphor according to aspects of the invention.
Figure 6B:
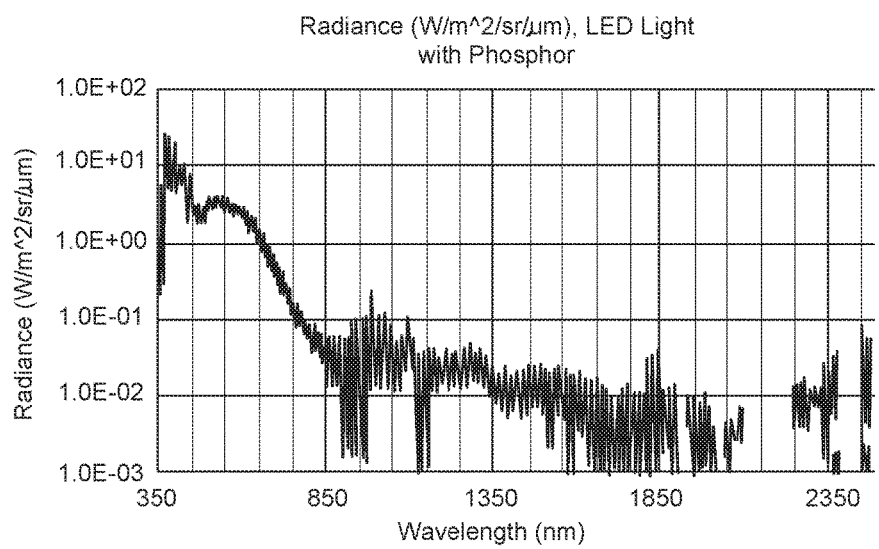
FIG. 6B is a graph showing the spectral power distribution of the UV LED of FIG. 6A with a phosphor coated window according to aspects of the invention.

According to certain embodiments, the UV LED-phosphor combination provides an efficient broadband "white light" source that has sufficient irradiance over the spectral range from 0.4 to 0.7 μm to calibrate a hyperspectral detector. FIG. 6A illustrates the emission spectrum of a UV LED light source according to one embodiment. As may be seen with reference to FIG. 6A, the light source has a high narrowband emission around 0.38 μm±0.03 μm, and continuous emission with sufficient intensity through the visible spectral range to at least about 0.95 μm. FIG. 6B illustrates the emission spectrum of the same UV LED light source, but with an additional phosphor window. As shown there is still a high narrowband emission at about 0.38 μm±0.03 μm, with a roughly monotonic decreasing distribution from blue to red. In particular, the UV LED-phosphor combination light source has relatively high irradiance at the shorter blue wavelengths, for example, between 0.4 and 0.43 μm.

As discussed above, because the UV LED is based on solid state semiconductor technology, it does not generate spatially non-uniform images, as does a filament-based light source, and therefore it may not be necessary to extensively randomize the source image. However, in some cases, a diffuser can be used on the output of, or in conjunction with, the UV LED-phosphor light source. In addition to having sufficient irradiance over the full visible spectral range, including the shorter blue wavelengths, to allow for intensity calibration of a hyperspectral detector, according to certain embodiments, the UV LED-phosphor light source may produce an emission spectrum having a plurality of well-known, well-defined peaks that can be used to also perform wavelength calibration of the hyperspectral detector.

Figure 7:
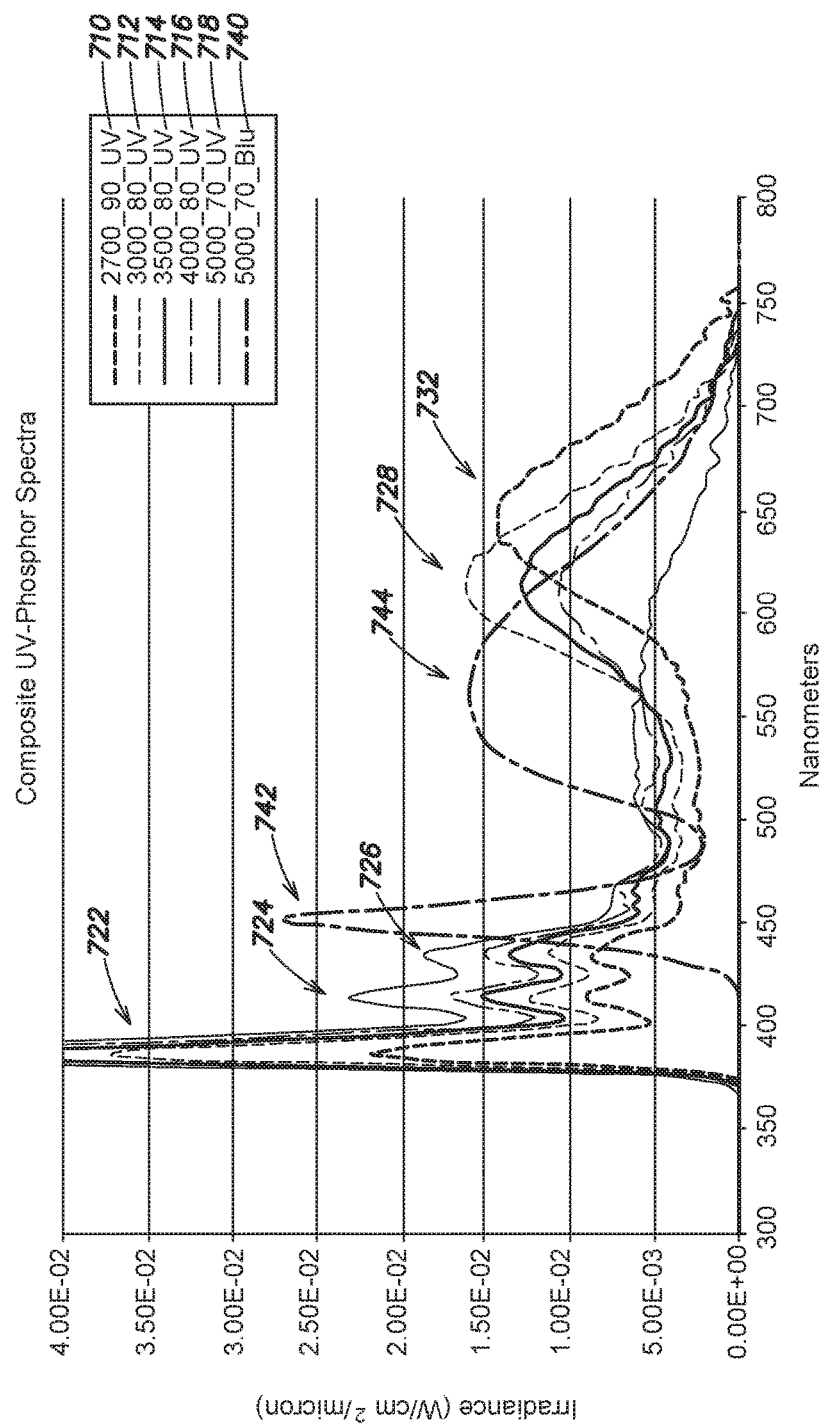
FIG. 7 is a graph showing composite UV-phosphor spectra in accordance with aspects of the invention.

Referring to FIG. 7, there are illustrated emission spectra of a composite UV-phosphor light source at different color correlated operating temperatures. Trace 710 corresponds to a blackbody equivalent temperature of 2700 K, trace 712 corresponds to a CCT of 3000K, trace 714 corresponds to a CCT of 3500 K, trace 716 corresponds to a CCT of 4000 K, and trace 718 corresponds to a CCT of 5000 K. The graph shows continuous white light emission from the phosphor-coated UV LED (curves 710-718) from about 0.4 to about 0.7 μm. In addition, the emission spectra include several clearly defined peaks around the shorter blue light wavelengths. These clearly defined peaks can be used as reference points for hyperspectral calibration. Specifically, as shown, at each operating temperature the spectra from the composite UV LED-phosphor light source have a plurality of well-defined peaks, including a first peak centered around 380 nm (indicated by reference numeral 722), and two peaks in the blue region, namely, a second peak centered around 420 nm (indicated by reference numeral 724) and a third peak centered around 440 nm (indicated by reference numeral 726). These peaks may be used as wavelength markers to calibrate the wavelength of the images taken by the hyperspectral detector. As expected, the intensity of these relatively short wavelength peaks decreases with decreasing operating temperature. Given a known operating temperature of the calibrator, the peaks (722, 724, 726) can further be used to calibrate the intensity of the hyperspectral images. In addition to the three peaks 722, 724, and 726, the spectra from the mid-temperatures (traces 712, 714, and 716) also shown a well-defined, though broader, peak in the red region centered around 620 nm (indicated by reference numeral 728). This peak can further be used to perform wavelength or intensity calibration of the hyperspectral detector. As shown, at the lowest blackbody equivalent temperature, 2700 K (trace 710), the spectrum exhibits a red-region peak, indicated at reference numeral 732, but this peak is red-shifted relative to the peaks 726 produced at higher equivalent temperatures, and is centered around 650 nm. The peak is still well-defined and can be used for wavelength or intensity calibration, given a known CCT. At the highest measured CCT (5000 K), the red-region peak 726 is no longer present, but the composite UV LED-phosphor light source still produces sufficient irradiance over the 400-700 nm band to be used for intensity calibration of the hyperspectral detector, as shown by trace 718.

For contrast, trace 740 represents the emission spectrum from a comparative blue LED light source. Trace 740 shows only two peaks centered at about 450 nm (indicated by reference number 742) and about 550 nm (indicated by reference numeral 744). This is similar to the blue LED emission spectrum shown in FIG. 2. As shown, the blue LED does not produce irradiance below about 420 nm, and is therefore missing the shorter blue wavelengths necessary for hyperspectral calibration.

Thus, according to certain embodiments, a composite UV LED-phosphor light source can produce continuous "white light" emission over the full visible spectral range, and even extending into the near ultraviolet. In addition, the emission spectrum from this composite UV LED-phosphor light source advantageously includes several well-defined peaks at specific, known wavelengths that can be used to perform wavelength calibration in addition to intensity calibration. Furthermore, as discussed above, the composite UV LED-phosphor light source has good stability, radiation hardness, robustness to thermal cycling, and long life.

Certain applications may require or prefer a visible light source that provides higher intensity emission levels than can be generated using a single composite UV-LED-phosphor light source. Accordingly, multiple UV LED-phosphor light sources can be combined together and coupled with suitable optics (e.g., one or more collimating lenses) to concentrate the photon flux and produce a higher-power output. In another example, higher-power UV LEDs can be used in applications where higher power driving sources are available, thereby reducing the number of LEDs that may need to be combined to produce an output with sufficient intensity.

According to certain embodiments, a full range hyperspectral calibrator can be constructed using a composite UV LED-phosphor to provide a visible source and a lower temperature filament-based lamp that emits radiation at the near infrared, short wave infrared, mid wave infrared, and long wave infrared wavelengths to provide an infrared source. These two sources together can provide a long-life, low power, and temperature cycling robust calibrator.

Figure 8B:
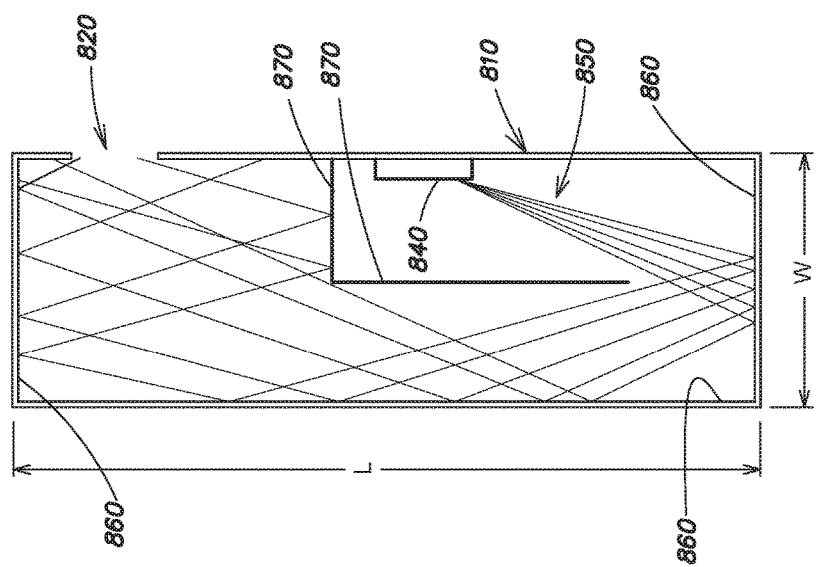
FIG. 8B is a schematic cross-section and ray trace of one example of the hyperspectral calibrator of FIG. 8A in accordance with aspects of the invention.
Figure 8A:
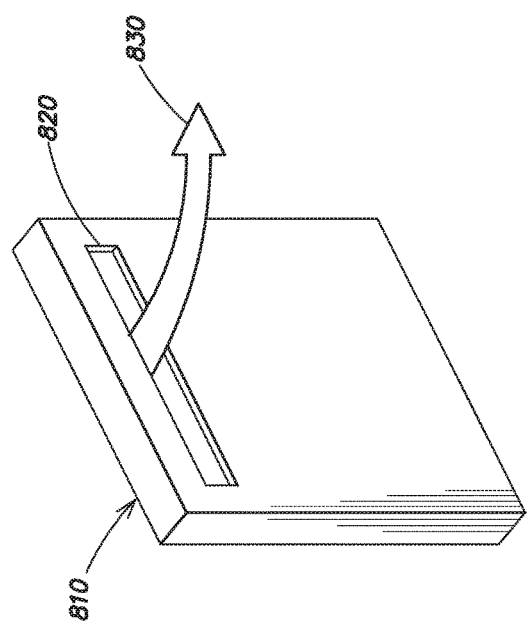
FIG. 8A is a schematic drawing of one example of a hyperspectral calibrator in accordance with aspects of the invention.

Referring to FIG. 8A, a schematic illustration of one example of a hyperspectral "box" calibrator is shown. A box calibrator is a fully shielded, self-contained calibration system that can be packaged with a hyperspectral imaging system to provide an "on-board" calibrator, as discussed above. Box calibrators are typically compact and low-profile. In certain examples, the box calibrator can be conveniently movable mounted such that it can be moved into and out of the optical path to the hyperspectral detector as needed. As shown schematically in FIG. 8A, the box calibrator includes a housing 810 that houses the light source(s) and any control electronics. The housing 810 is constructed from a material that is optically opaque, at least to visible and infrared light. The housing 810 includes an output slit 820 through which the output light beam 830 from the calibrator is emitted.

FIG. 8B shows a schematic cross-sectional view of one example of the box calibrator of FIG. 8A. As discussed above, the box calibrator can be relatively small, and designed with a low profile. The dimensions of the calibrator may depend on the desired uniform output size. For example, a calibrator having a uniform output size of 1 in. may have dimensions of length in a range of 6-7 in. and width in a range of 2-3 in. For example, the calibrator may have a length of 6.5 in. and a width of 2.5 in. The calibrator includes a light source 840, which as discussed above, can include one or more composite UV LED-phosphor light sources to provide continuous emission over at least approximately 0.4-0.7 µm, and optionally also an infrared light source, such as a filament-based light source. The housing 810 can be configured such that the light 850 output from the light source 840 undergoes a minimum of three "bounces" or reflections from the inner surfaces 860 of the housing 810 (i.e., Lambertian scattering) to exit the output slit 820 as a uniform output beam 830. In certain examples the housing 810 can include baffles 870 to shield the source 840 and provide additional reflective surfaces to reflect the light toward the output slit 820. As discussed above, in certain examples the emissions from a composite UV LED-phosphor light source do not carry a spatially distinct pattern, and therefore randomization may not be necessary. However, in some applications or embodiments, for example, where multiple LEDs are used for higher intensity emission, some randomization may be preferred. Accordingly, in certain examples one or more of the inner surfaces 860 of the housing 810 or the surfaces of the baffle(s) 870 can be coated with a diffuser. For example, the diffuser may be composed of a fluoropolymer, particularly for visible to near-short-wave infrared wavelengths. In another embodiment, the diffuser may be composed of gold, particularly for long wave infrared wavelengths. Alternatively, or in addition, a diffuse window can be placed at or proximate the output slit 820 to diffuse the output light as it exits the slit as beam 830.

Thus, aspects and embodiments provide a hyperspectral calibrator that generates spectrally continuous light at least covering the wavelength range 0.4-0.7 µm and optionally also including one or more of the NIR, SWIR, MWIR, and LWIR spectral bands. The calibrator can further provide multiple wavelength reference points for calibration. Embodiments of the calibrator are based on highly efficient LED illumination technology, and therefore have low power requirements. Additionally, the use of solid state semiconductor based LED lighting relieves the need to extensively randomize the source image, for example using an integrating sphere, because these light sources do not generate spatially non-uniform images. Rather, relatively simple diffuse coatings or windows can be used in some examples, and in other examples no randomization is necessary. Furthermore, as discussed above, the composite UV LED-phosphor light sources are radiation hard and robust to thermal cycling, capable of being turned on and off many thousands or even millions of times without failure, unlike filament-based sources which are prone to filament breakage due to thermal cycling. Composite UV LED-phosphor light sources are also small, enabling compact packaging and the ability to easily selectively illuminate the hyperspectral detector, either directly (by moving the calibrator into the optical path of the detector) or using minimal intervening optics.

Having described above various features and aspects of at least one embodiment, it will be appreciated that various alterations, modifications, and improvements will readily occur to those skilled in the art. Such alterations, modifications, and improvements are intended to be part of this disclosure and are intended to be within the scope of the invention. Those skilled in the art will appreciate that the parameters and configurations described herein are exemplary and that actual parameters and/or configurations will depend on the specific application in which the disclosed systems and techniques are used. Those skilled in the art should also recognize or be able to ascertain, using no more than routine experimentation, equivalents to the specific embodiments disclosed. It is therefore to be understood that the embodiments described herein are presented by way of example only and that, within the scope of the appended claims and equivalents thereto, the disclosed embodiments may be practiced otherwise than as specifically described. Accordingly the foregoing description and figures are by way of example only, and the scope of the invention should be determined from proper construction of the appended claims, and their equivalents.

What is claimed is:

1. A hyperspectral calibrator comprising:
   a housing having an output opening; and
   a composite light source disposed within the housing, the composite light source including an ultraviolet light emitting diode (UV LED) and a phosphor arranged such that a first beam generated by the UV LED is transmitted through the phosphor to produce and emit a calibration beam that is spectrally continuous over a wavelength range extending from 0.4 µm to 0.7 µm, wherein the housing and the composite light source are configured to direct the calibration beam emitted from the composite light source to the output opening of the housing to produce the calibration beam at the output opening.

2. The hyperspectral calibrator of claim 1 wherein the housing is configured such that the calibration beam emitted from the composite light source undergoes at least three reflections within the housing before exiting from the output opening.

3. The hyperspectral calibrator of claim 1 wherein the housing further comprises a baffle partially surrounding the composite light source.

4. The hyperspectral calibrator of claim 1 wherein at least one inner surface of the housing includes a diffusive coating.

5. The hyperspectral calibrator of claim 4 wherein the diffusive coating includes a fluoropolymer.

6. The hyperspectral calibrator of claim 1 wherein the phosphor is arranged as a phosphor coating on the UV LED.

7. The hyperspectral calibrator of claim 6 wherein the phosphor coating includes an inorganic metal oxide.

8. The hyperspectral calibrator of claim 6 wherein the composite light source includes a plurality of UV LEDs each having the phosphor coating.

9. The hyperspectral calibrator of claim 1 wherein the composite light source is configured to emit the calibration beam with an emission spectrum that includes a plurality of defined peaks within the wavelength range.

10. The hyperspectral calibrator of claim 1 further comprising an infrared light source disposed within the housing and configured to produce an infrared calibration beam, the housing being further configured to direct the infrared calibration beam through the output opening.

11. A hyperspectral imaging system comprising:
a hyperspectral sensor configured to collect light from an observed scene and to output a two-dimensional image of the observed scene; and
a hyperspectral calibrator including an ultraviolet (UV) light emitting diode (LED) and a phosphor, the hyperspectral calibrator being configured to emit visible light that is spectrally continuous over a wavelength range extending from 0.4 µm to 0.7 µm, the hyperspectral calibration being further configured to selectively direct a calibration beam to the hyperspectral sensor, the calibration beam including the visible light.

12. The hyperspectral imaging system of claim 11 wherein the phosphor comprises an inorganic metal oxide.

13. The hyperspectral imaging system of claim 11 wherein the phosphor is arranged as a phosphor coating on the UV LED.

14. The hyperspectral imaging system of claim 11 wherein the hyperspectral calibrator further comprises an infrared light source configured to emit infrared light, and wherein the calibration beam further includes the infrared light.

15. The hyperspectral imaging system of claim 13 wherein the hyperspectral calibrator includes a plurality of UV LEDs each having the phosphor coating.

16. The hyperspectral imaging system of claim 11 wherein the hyperspectral calibrator is configured to emit the visible light with an emission spectrum that includes a plurality of defined peaks within the wavelength range.

17. A method of hyperspectral calibration comprising:
providing a composite light source including an ultraviolet (UV) light emitting diode (LED) and a phosphor;
generating a calibration beam including visible light emitted from the composite light source, the visible light being spectrally continuous over a wavelength range extending from 0.4 µm to 0.7 µm;
selectively directing the calibration beam to a hyperspectral imaging sensor;
measuring an output from the hyperspectral imaging sensor responsive to receiving the calibration beam at the hyperspectral imaging sensor to provide a measured output; and
calibrating the hyperspectral imaging sensor based on a comparison between the measured output and a known spectrum of the calibration beam.

18. The method of claim 17 wherein the known spectrum of the calibration beam includes a plurality of defined peaks within the wavelength range, and wherein calibrating the hyperspectral imaging sensor includes performing wavelength calibration based on at least one of the plurality of defined peaks.

* * * * *